United States Patent [19]
Choi

[11] Patent Number: 5,768,197
[45] Date of Patent: Jun. 16, 1998

[54] REDUNDANCY CIRCUIT FOR SEMICONDUCTOR MEMORY DEVICE

[75] Inventor: Jae Myoung Choi, Kyoungki-do, Rep. of Korea

[73] Assignee: Hyundai Electronics Industries Co., Ltd., Rep. of Korea

[21] Appl. No.: 774,318

[22] Filed: Dec. 24, 1996

[30] Foreign Application Priority Data

Dec. 29, 1995 [KR] Rep. of Korea .................. 95-66027

[51] Int. Cl.$^6$ .................................................. G11C 5/00
[52] U.S. Cl. ...................... 365/200; 365/194; 365/225.7
[58] Field of Search .......................... 365/200, 225.7, 365/194

[56] References Cited

U.S. PATENT DOCUMENTS

| | | |
|---|---|---|
| 4,829,480 | 5/1989 | Seo . |
| 4,885,721 | 12/1989 | Katanosaka . |
| 5,461,587 | 10/1995 | Oh ........................ 365/200 |
| 5,469,388 | 11/1995 | Park ...................... 365/200 |
| 5,499,214 | 3/1996 | Mori et al. ............ 365/225.7 |
| 5,574,689 | 11/1996 | Morgan ................ 365/225.7 |

*Primary Examiner*—Joseph E. Clawson, Jr.
*Attorney, Agent, or Firm*—Gary M. Nath; Nath & Associates

[57] ABSTRACT

A redundancy circuit for a semiconductor memory device, comprising a first precharge transistor for transferring a precharge voltage to a first node in response to a first precharge signal, a second precharge transistor for transferring the precharge voltage transferred by the first precharge transistor to the first node in response to a second precharge signal, a first inverter for inverting a signal at the first node, an output terminal for transferring an output signal from the first inverter externally, a first NMOS transistor for transferring a supply voltage to the first node in response to a signal at the output terminal, a second inverter for inverting the second precharge signal, a second NMOS transistor for transferring a ground voltage to a second node in response to an output signal from the second inverter, a third NMOS transistor for transferring the ground voltage to the second node in response to the signal at the output terminal, a plurality of fourth NMOS transistors connected in parallel between the first and second nodes, for transferring a signal at the second node to the first node in response to an input address, and a plurality of fuses connected respectively between the first node and the fourth NMOS transistors, for programming a failed address.

31 Claims, 8 Drawing Sheets

FIG. 1
(PRIOR ART)

INI

OUT

FIG. 2c (Prior Art)

OUT2

FIG. 2d (Prior Art)

Aij

FIG. 2e (Prior Art)

Aijb

Aij

FIG. 4e

Aijb

FIG. 4f

OUT

FIG. 5

INI

Aij

FIG. 6e

Aijb

FIG. 6f

OUT

Aij

FIG. 8e

Aijb

FIG. 8f

OUT

REDUNDANCY CIRCUIT FOR SEMICONDUCTOR MEMORY DEVICE

BACKGROUND OF THE INVENTION

1. Field of the Invention

The present invention relates in general to redundancy circuits for semiconductor memory devices, and more particularly to a redundancy circuit which is used in a semiconductor memory device such as dynamic random access memory (DRAM) or static random access memory (SRAM) to, when a specific address is applied to the memory device to select a failed cell, prevent a different address from being made active due to noise in the memory device, so as to avoid a faulty operation of the memory device.

2. Description of the Prior Art

Generally, a redundancy circuit is used in a semiconductor memory device to, if any one of cells in a cell array fails, replace a word line connected to the failed cell with a spare or repair word line, so as to repair the failure. In a repair operation for the failed cell replacement, when an address is applied to the memory device to select the failed cell, a normal operation path for the failed cell is cut off while the redundancy circuit is operated to enable a repair cell.

Figure 1:
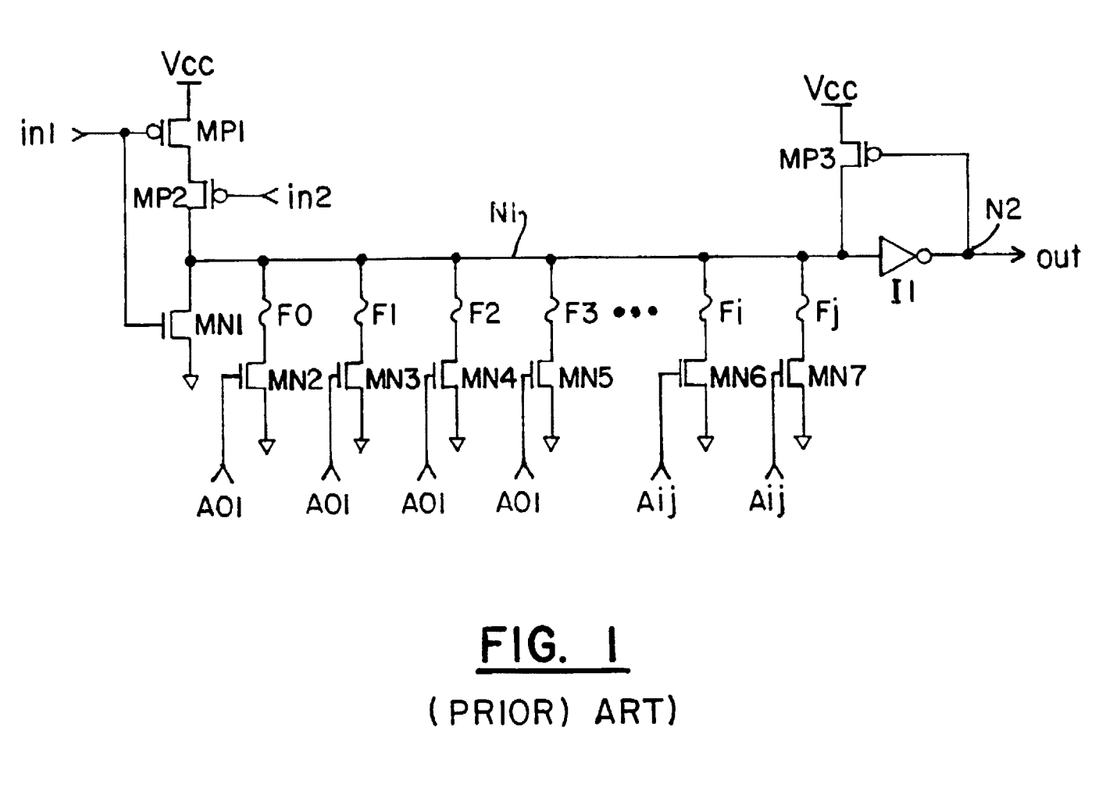
FIG. 1 is a circuit diagram of a conventional redundancy circuit for performing a repair operation.

FIG. 1 is a circuit diagram of a conventional redundancy circuit for performing a repair operation. As shown in this drawing, the conventional redundancy circuit comprises a first PMOS transistor or first precharge transistor MP1 for transferring a precharge voltage of supply voltage level Vcc to a first node N1 in response to a first precharge signal in, a second PMOS transistor or second precharge transistor MP2 for transferring the precharge voltage of supply voltage level Vcc transferred by the first precharge transistor MP1 to the first node N1 in response to a second precharge signal in2, a first NMOS transistor MN1 for transferring a ground voltage Vss to the first node N1 in response to the first precharge signal in, and a plurality of NMOS transistors or repair transistors MN2–MN7 connected in parallel to the first node N1 to transfer the ground voltage Vss to the first node N1 in response to an input address A01–Aij. The repair transistors MN2–MN7 have gates for inputting bits of the address A01-Aij, respectively.

The conventional redundancy circuit further comprises a plurality of fuses F0–Fj connected respectively between the first node N1 and the repair transistors MN2–MN7 to program a failed address, an inverter I1 connected between the first node N1 and a second node or output terminal N2, and a third PMOS transistor MP3 for transferring the supply voltage Vcc to the first node N1 in response to an output signal out at the output terminal N2.

The operation of the conventional redundancy circuit with the above-mentioned construction will hereinafter be described with reference to FIGS. 2a to 2f.

Figure 2A:
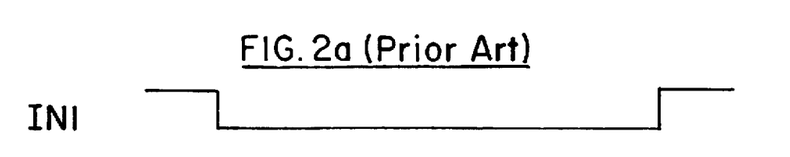
FIGS. 2a to 2f are timing diagrams illustrating the operation of the conventional redundancy circuit in FIG. 1.
Figure 2B:
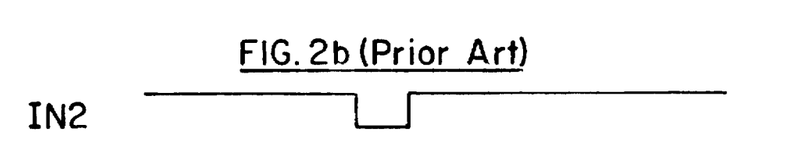
Figure 2C:
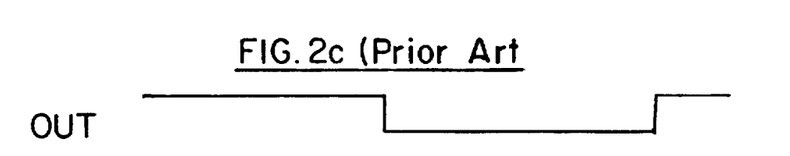
Figure 2D:
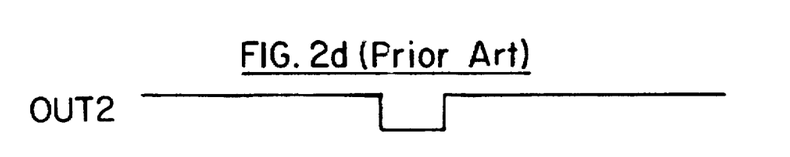
Figure 2E:
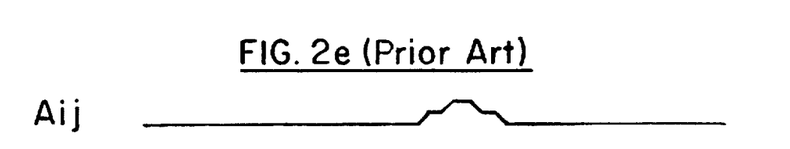
Figure 2F:
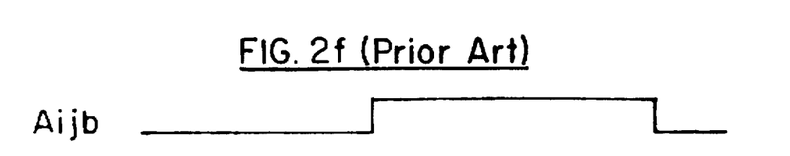

FIGS. 2a to 2f are timing diagrams illustrating the operation of the conventional redundancy circuit in FIG. 1. First, when the first precharge signal in1 goes from high to low in logic as shown in FIG. 2a and the second precharge signal in1 then goes from high to low in logic as shown in FIG. 2b, the first and second precharge transistors MP1 and MP2 are turned on to transfer the supply voltage Vcc to the first node N1. Then, if the address bits A01–Aij are applied to the gates of the repair transistors MN2–MN7, respectively, a signal at the first node N1 becomes high or low in logic according to whether the fuses F0–Fj blow, thereby causing the output signal out at the output terminal N2 to be driven.

For example, in the case where the address bits A/01 and Ai/j are high in logic and the remaining address bits are low in logic to select a failed cell, the fuses F1 and Fi blow to replace the failed cell with a repair cell. In this case, the signal at the first node N1 is maintained at its high low state due to the precharge voltage of supply voltage level Vcc transferred by the first and second precharge transistors MP1 and MP2. As a result, the output signal out at the output terminal N2 is maintained at its low logic state, thereby causing the repair operation to be performed to replace the failed cell with the repair cell.

If the address bits, for example, A01 and Aij are high in logic and the remaining address bits are low in logic to select a normal cell under the condition that the fuses F1 and Fi have blown, the repair transistors MN2 and MN7 are turned on to make the signal at the first node N1 low in logic and the output signal out at the output terminal N2 high in logic. As a result, the repair operation is not performed.

In the repair operation where the address bits A/01 and Ai/j are high in logic, the signal at the first node N1 must always remain at its high logic state by the third PMOS transistor MP3 with its gate connected to the output terminal N2. However, a different address bit which must be low in logic may not have the ground voltage level Vss but a threshold voltage level Vtn or more due to noise in the chip, like the address bit Aij in FIG. 2e. As a result, the corresponding repair transistor MN7 is turned on to discharge the signal at the first node N1, thereby causing the signal at the first node N1 to become low in logic and the output signal out at the output terminal N2 to go from low to high in logic. Such a logic transition of the output signal out causes the repair operation not to be performed although a specific address is applied to select a failed cell.

SUMMARY OF THE INVENTION

Therefore, the present invention has been made in view of the above problem, and it is an object of the present invention to provide a redundancy circuit for a semiconductor memory device which is capable of normally performing a repair operation with no influence of noise in a chip to replace a failed cell with a spare cell.

In accordance with one aspect of the present invention, a redundancy circuit for a semiconductor memory device is provided and comprises first precharge means for transferring a precharge voltage to a first node in response to a first precharge signal; second precharge means for transferring the precharge voltage transferred by the first precharge means to the first node in response to a second precharge signal; first inversion means for inverting a signal at the first node; an output terminal for transferring an output signal from the first inversion means externally; first switching means for transferring a supply voltage to the first node in response to a signal at the output terminal; second inversion means for inverting the second precharge signal; second switching means for transferring a ground voltage to a second node in response to an output signal from the second inversion means; third switching means for transferring the ground voltage to the second node in response to the signal at the output terminal; a plurality of fourth switching means connected in parallel between the first and second nodes, for transferring a signal at the second node to the first node in response to an input address, each of the fourth switching means having its gate for inputting a corresponding one of a plurality of bits of the input address; and a plurality of fuses connected respectively between the first node and the fourth switching means, for programming a failed address.

In accordance with another aspect of the present invention, a redundancy circuit for a semiconductor memory device is provided and comprises first precharge means for transferring a precharge voltage to a first node in response to a first precharge signal; second precharge means for transferring the precharge voltage transferred by the first precharge means to the first node in response to a second precharge signal; inversion means for inverting a signal at the first node; an output terminal for transferring an output signal from the inversion means externally; first switching means for transferring a supply voltage to the first node in response to a signal at the output terminal; edge signal generation means for generating an edge signal with a predetermined delay width in response to the signal at the output terminal; second switching means for transferring a ground voltage to a second node in response to an output signal from the edge signal generation means; a plurality of third switching means connected in parallel between the first and second nodes, for transferring a signal at the second node to the first node in response to an input address, each of the third switching means having its gate for inputting a corresponding one of a plurality of bits of the input address; and a plurality of fuses connected respectively between the first node and the third switching means, for programming a failed address.

In accordance with yet another aspect of the present invention, a redundancy circuit for a semiconductor memory device is provided and comprises first precharge means for transferring a precharge voltage to a first node in response to a first precharge signal; second precharge means for transferring the precharge voltage transferred by the first precharge means to the first node in response to a second precharge signal; inversion means for inverting a signal at the first node; an output terminal for transferring an output signal from the inversion means externally; first switching means for transferring a supply voltage to the first node in response to a signal at the output terminal; edge signal generation means for generating an edge signal with a predetermined width in response to the signal at the output terminal and the second precharge signal; second switching means for transferring a ground voltage to a second node in response to an output signal from the edge signal generation means; a plurality of third switching means connected in parallel between the first and second nodes, for transferring a signal at the second node to the first node in response to an input address, each of the third switching means having its gate for inputting a corresponding one of a plurality of bits of the input address; and a plurality of fuses connected respectively between the first node and the third switching means, for programming a failed address.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 3:
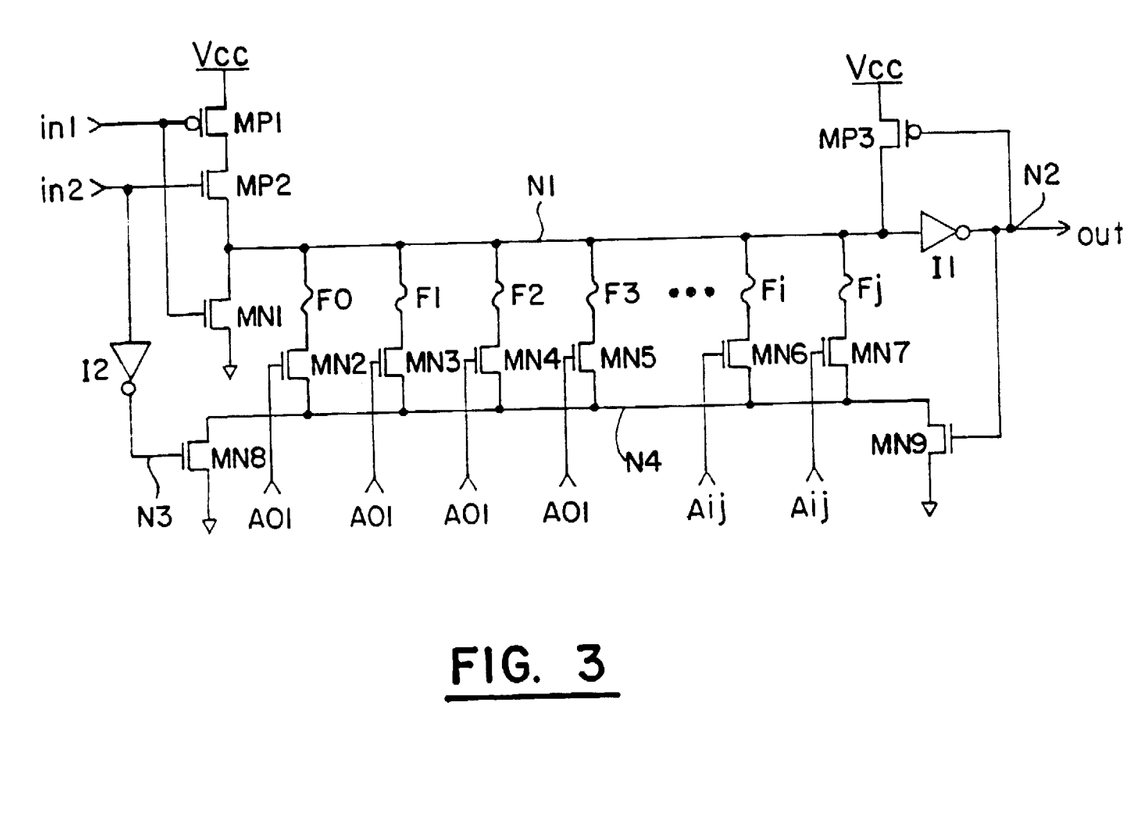
FIG. 3 is a circuit diagram of a redundancy circuit for a semiconductor memory device in accordance with a first embodiment of the present invention.

FIG. 3 is a circuit diagram of a redundancy circuit for a semiconductor memory device in accordance with a first embodiment of the present invention. As shown in this drawing, the redundancy circuit comprises a first PMOS transistor or first precharge transistor MP1 for transferring a precharge voltage of supply voltage level Vcc to a first node N1 in response to a first precharge signal in1 (see FIG. 4a), a second PMOS transistor or second precharge transistor MP2 for transferring the precharge voltage of supply voltage level Vcc transferred by the first precharge transistor MP1 to the first node N1 in response to a second precharge signal in2 (see FIG. 4b), a first NMOS transistor MN1 for transferring a ground voltage Vss to the first node N1 in response to the first precharge signal in1, a first inverter I1 connected between the first node N1 and a second node or output terminal N2, and a third PMOS transistor MP3 for transferring the supply voltage Vcc to the first node N1 in response to an output signal out at the output terminal N2.

The redundancy circuit further comprises a second inverter I2 for inverting the second precharge signal in2 and outputting the inverted signal to a third node N3, an eighth NMOS transistor MN8 for transferring the ground voltage Vss to a fourth node N4 in response to a signal at the third node N3, a ninth NMOS transistor MN9 for transferring the ground voltage Vss to the fourth node N4 in response to the output signal out at the output terminal N2, a plurality of NMOS transistors or repair transistors MN2–MN7 connected in parallel between the first and fourth nodes N1 and N4 to transfer a signal at the fourth node N4 to the first node N1 in response to an input address A01–Aij, and a plurality of fuses F0–Fj connected respectively between the first node N1 and the repair transistors MN2–MN7 to program a failed address. The repair transistors MN2–MN7 have gates for inputting bits of the address A01–Aij, respectively.

The operation of the redundancy circuit with the above-mentioned construction in accordance with the first embodiment of the present invention will hereinafter be described in detail with reference to FIGS. 4a to 4f.

Figure 4A:
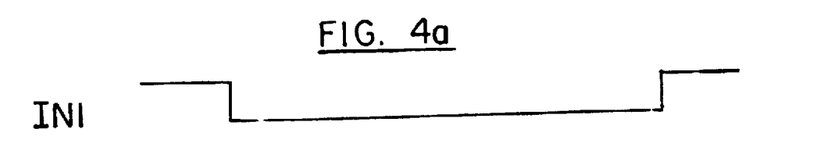
FIGS. 4a to 4f are timing diagrams illustrating the operation of the redundancy circuit in FIG. 3.
Figure 4B:
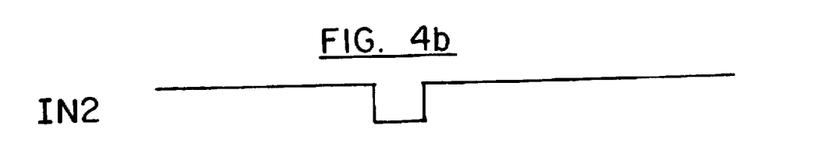
Figure 4C:
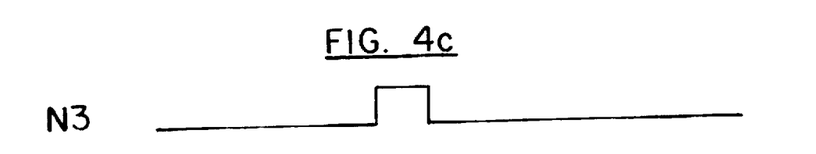

FIGS. 4a to 4f are timing diagrams illustrating the operation of the redundancy circuit in FIG. 3. First, when the first precharge signal in1 goes from high to low in logic as shown in FIG. 4a and the second precharge signal in1 then goes from high to low in logic as shown in FIG. 4b, the first and second precharge transistors MP1 and MP2 are turned on to transfer the supply voltage Vcc to the first node N1. As a result, a signal at the first node N1 becomes high in logic. At this time, because the signal at the third node N3 is high in logic, the eighth NMOS transistor MN8 is turned on to transfer the ground voltage Vss to the fourth node N4. An a result, the signal at the fourth node N4 becomes low in logic.

For example, in the case where the address bits A/01 and Ai/j are high in logic and the remaining address bits are low in logic to select a failed cell, the fuses F1 and Fi blow to perform a repair operation. If the address bits A01 and Aij are high in logic under the condition that the fuses F1 and Fi have blown, the repair transistors MN2 and MN7 are turned on to change the signal at the first node N1 from high to low in logic and the output signal out at the output terminal N2 from low to high in logic. Then, the ninth NMOS transistor MN9 is turned on in response to the high logic signal at the output terminal N2 to allow the signal at the first node N1 to remain at its low logic state. Similarly, the output signal out at the output terminal N2 remains at its high logic state. As a result, the repair operation is not performed.

If the address bits A/01 and Ai/j are high in logic and the remaining address bits are low in logic, the signal at the first node N1 becomes high in logic and the output signal out at the output terminal N2 becomes low in logic, thereby causing the ninth NMOS transistor MN9 to be turned off. As the ninth NMOS transistor MN9 is turned off, the signal at the first node N1 remains at its high logic state and the output signal out at the output terminal N2 remains at its low logic state. As a result, the repair operation is performed normally.

Figure 4D:
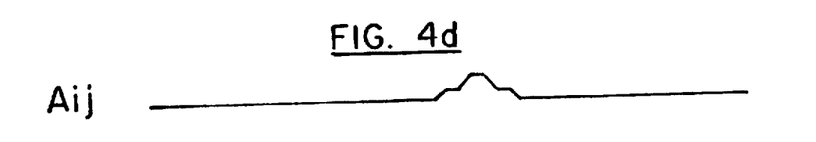
Figure 4E:
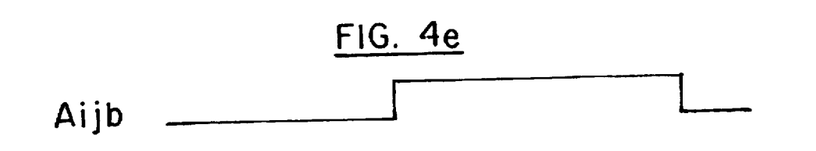
Figure 4F:
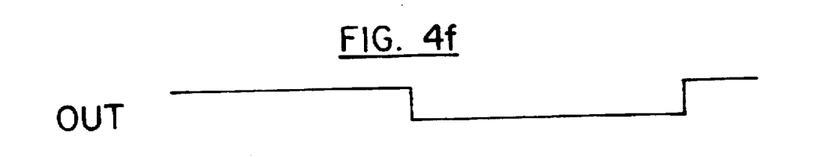

At this time, although an address bit, not selected, has a threshold voltage level Vtn or more due to noise in the chip, like the address bit Aij in FIG. 4d, and the corresponding repair transistor MN7 is then turned on, the signal at the first node N1 remains at its high logic state because the eighth and ninth NMOS transistors MN8 and MN9 remain at their OFF state. Hence, the repair operation is performed normally.

Figure 5:
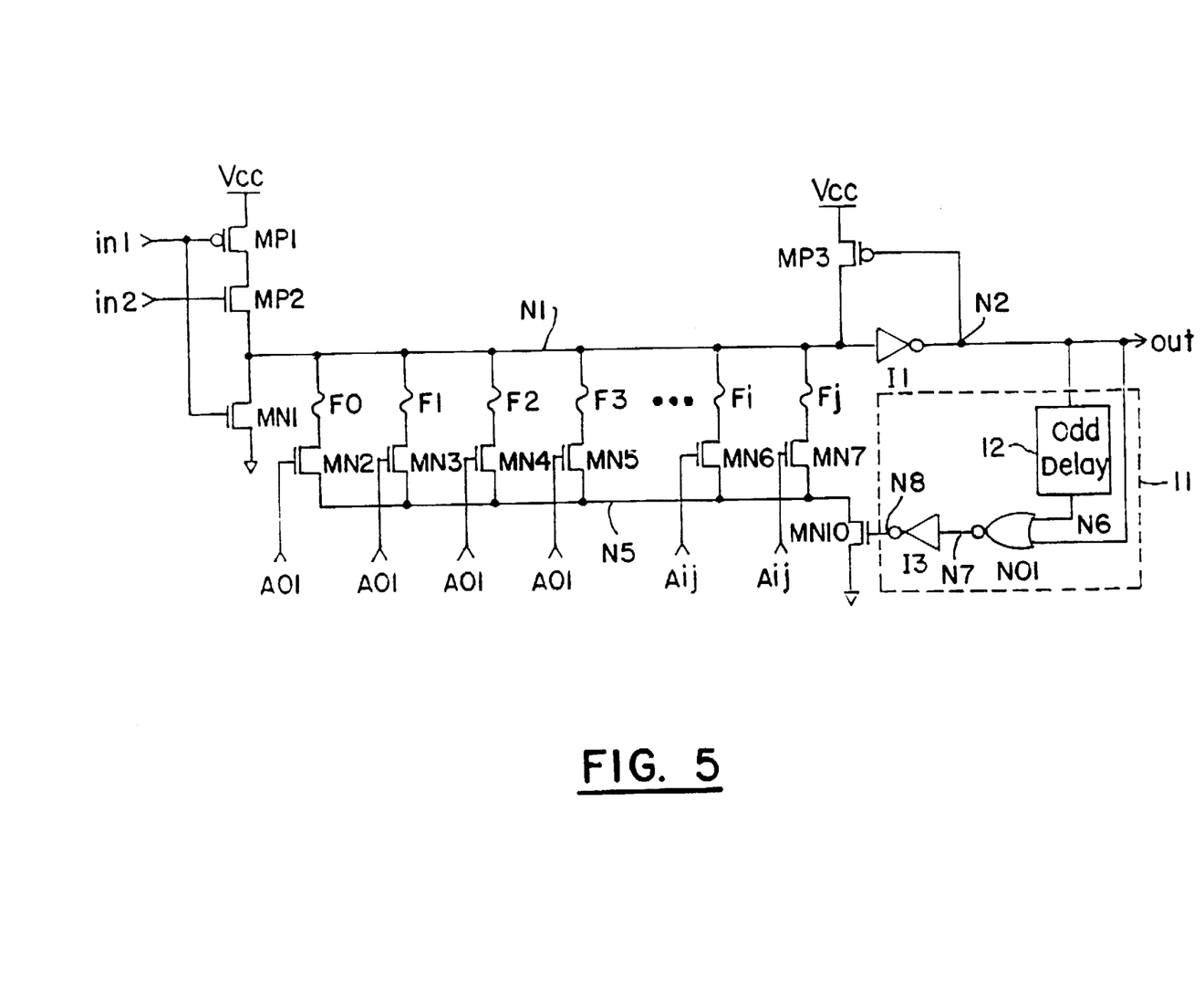
FIG. 5 is a circuit diagram of a redundancy circuit for a semiconductor memory device in accordance with a second embodiment of the present invention.

FIG. 5 is a circuit diagram of a redundancy circuit for a semiconductor memory device in accordance with a second embodiment of the present invention. As shown in this drawing, the redundancy circuit comprises a first PMOS transistor or first precharge transistor MP1 for transferring a precharge voltage of supply voltage level Vcc to a first node N1 in response to a first precharge signal in1, a second PMOS transistor or second precharge transistor MP2 for transferring the precharge voltage of supply voltage level Vcc transferred by the first precharge transistor MP1 to the first node N1 in response to a second precharge signal in2, a first NMOS transistor MN1 for transferring a ground voltage Vss to the first node N1 in response to the first precharge signal in1, a first inverter I1 connected between the first node N1 and a second node or output terminal N2, and a third PMOS transistor MP3 for transferring the supply voltage Vcc to the first node N1 in response to an output signal out at the output terminal N2.

The redundancy circuit further comprises an edge signal generation circuit 11 for generating an edge signal with a predetermined delay width in response to the output signal out at the output terminal N2, a tenth NMOS transistor MN10 for supplying the ground voltage Vss to a fifth node N5 in response to an output signal from the edge signal generation circuit 11, a plurality of NMOS transistors or repair transistors MN2–MN7 connected in parallel between the first and fifth nodes N1 and N5 to transfer a signal at the fifth node N5 to the first node N1 in response to an input address A01–Aij, and a plurality of fuses F0–FJ connected respectively between the first node N1 and the repair transistors MN2-MN7 to program a failed address. The repair transistors MN2–MN7 have gates for inputting bits of the address A01–Aij, respectively.

The edge signal generation circuit 11 includes an inversion delay circuit 12 for inverting and delaying the output signal out at the output terminal N2 for a predetermined time period and outputting the resultant signal to a sixth node N6, a NOR gate NO1 for NORing the output signal out at the output terminal N2 and a signal at the sixth node N6 and outputting the NORed result to a seventh node N7, and a third inverter 13 for inverting a signal at the seventh node N7 and outputting the inverted signal to an eighth node N8. Although not shown, the inversion delay circuit 12 is provided with an odd number of inverters.

The operation of the redundancy circuit with the above-mentioned construction in accordance with the second embodiment of the present invention will hereinafter be described in detail with reference to FIGS. 6a to 6g.

Figure 6A:
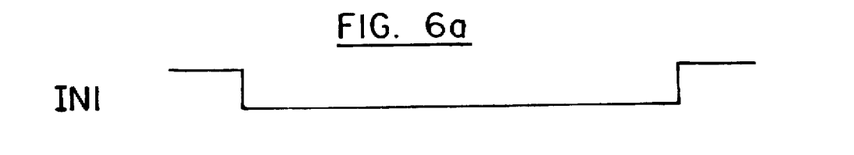
FIGS. 6a to 6g are timing diagrams illustrating the operation of the redundancy circuit in FIG. 5.
Figure 6B:
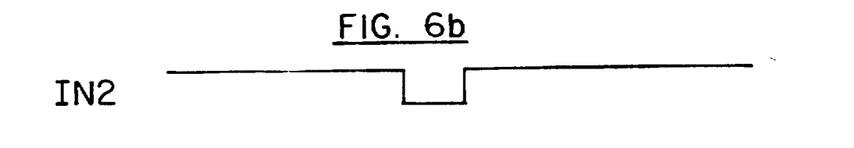
Figure 6C:
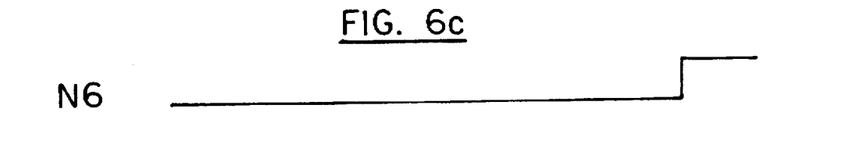

FIGS. 6a to 6g are timing diagrams illustrating the operation of the redundancy circuit in FIG. 5. First, if a repair address is applied to select a failed cell, a signal at the first node N1 goes from low to high in logic and the output signal out at the output terminal N2 goes from high to low in logic. At this time, in the edge signal generation circuit 11, the inversion delay circuit 12 inverts and delays the output signal out at the output terminal N2 for the predetermined time period and outputs the resultant signal to the NOR gate NO1 through the sixth node N6. The NOR gate NO1 performs the NOR operation with respect to the output signal out at the output terminal N2 and the output signal from the inversion delay circuit 12 and outputs the NORed result to the third inverter I3 through the seventh node N7. The third inverter I3 inverts the output signal from the NOR gate NO1 and outputs the inverted signal to a gate of the tenth NMOS transistor MN10 through the eighth node N8. Noticeably, the inversion delay circuit 12 is constructed in such a manner that its output signal at the sixth node N6 can have a low to high logic transition interval similar to that of the first precharge signal in1 in FIG. 6a, as shown in FIG. 6c.

Figure 6D:
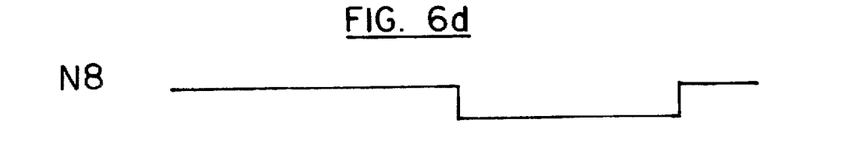
Figure 6E:
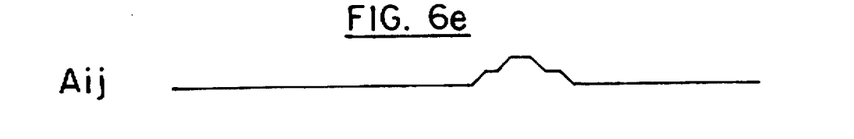
Figure 6F:
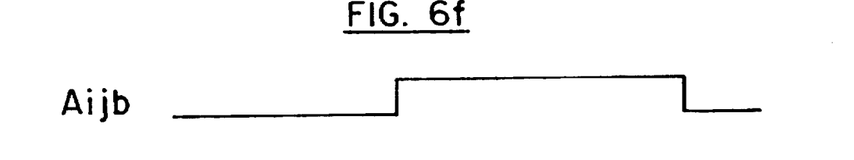
Figure 6G:
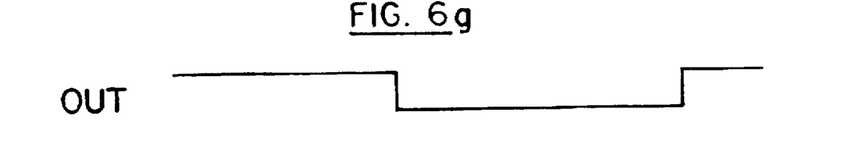

When the output signal out at the output terminal N2 becomes low in logic to perform a repair operation, a pulse signal at the is eighth node N8 goes from high to low in logic as shown in FIG. 6d to turn off the tenth NMOS transistor MN10. At this time, although an address bit, not selected, has a threshold voltage level Vtn or more due to noise in the chip, like the address bit Aij in FIG. 6e, and the corresponding repair transistor MN7 is then turned on, the signal at the first node N1 has no voltage variation because the tenth NMOS transistor MN10 remains at its OFF state. Then, if the signal at the sixth node N6 goes from low to high in logic in response to the output signal out at the output terminal N2, the signal at the eighth node N8 goes from low to high in logic to turn in the tenth NMOS transistor MN10, so as to accept a new address. Therefore, the repair operation is stably performed with no influence of noise in the chip.

Figure 7:
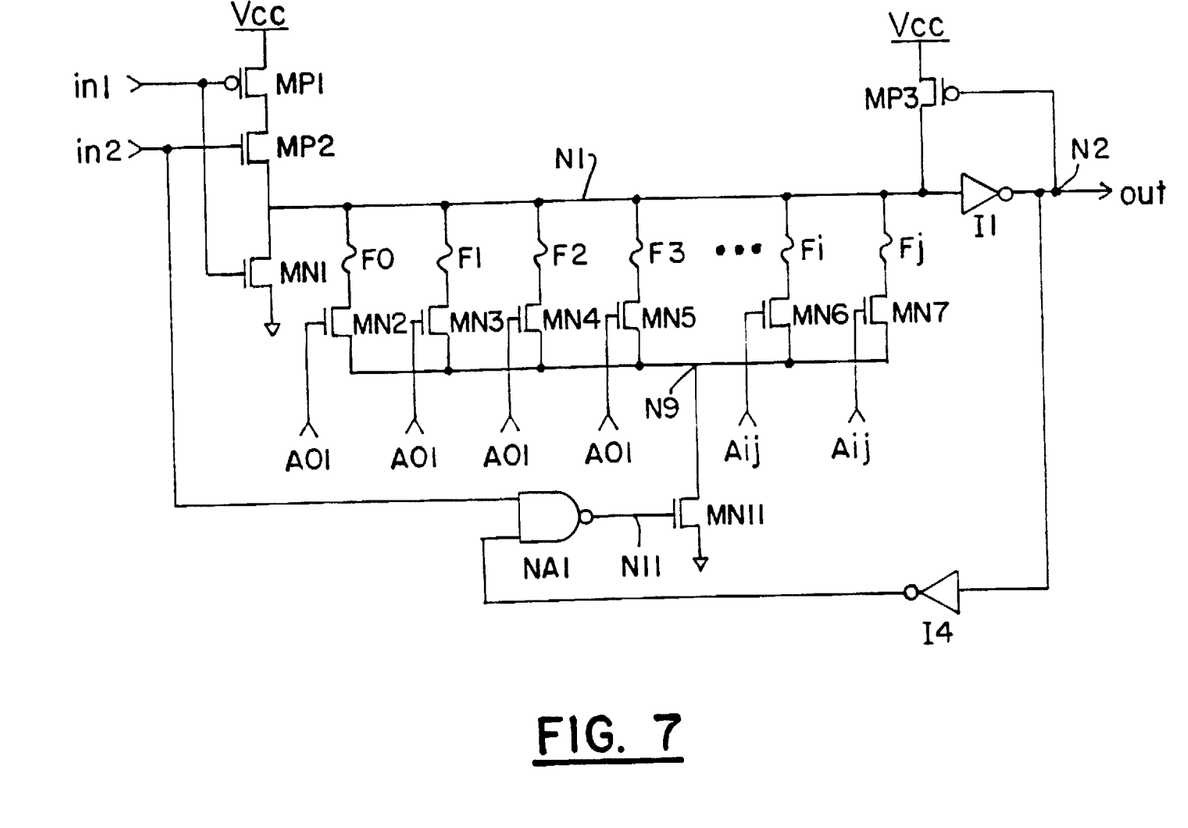
FIG. 7 is a circuit diagram of a redundancy circuit for a semiconductor memory device in accordance with a third embodiment of the present invention.

FIG. 7 is a circuit diagram of a redundancy circuit for a semiconductor memory device in accordance with a third embodiment of the present invention. As shown in this drawing, the redundancy circuit comprises a first PMOS transistor or first precharge transistor MP1 for transferring a precharge voltage of supply voltage level Vcc to a first node N1 in response to a first precharge signal in, a second PMOS transistor or second precharge transistor MP2 for transferring the precharge voltage of supply voltage level Vcc transferred by the first precharge transistor MP1 to the first node N1 in response to a second precharge signal in2, a first NMOS transistor MN1 for transferring a ground voltage Vss to the first node N1 in response to the first precharge signal in1, a first inverter I1 connected between the first node N1 and a second node or output terminal N2, and a third PMOS transistor MP3 for transferring the supply voltage Vcc to the first node N1 in response to an output signal out at the output terminal N2.

The redundancy circuit further comprises a fourth inverter 14 for inverting the output signal out at the output terminal N2 and outputting the inverted signal to a tenth node N10, a NAND gate NA1 for NANDing the second precharge signal in2 and a signal at the tenth node N10 and outputting the NANDed result to an eleventh node N11, an eleventh NMOS transistor MN11 for transferring the ground voltage Vss to a ninth node N9 in response to a signal at the eleventh node N11, a plurality of NMOS transistors or repair transistors MN2–MN7 connected in parallel between the first and ninth nodes N1 and N9 to transfer a signal at the ninth node N9 to the first node N1 in response to an input address A01–Aij, and a plurality of fuses F0–FJ connected respectively between the first node N1 and the repair transistors MN2–MN7 to program a failed address. The repair transistors MN2–MN7 have their gates for inputting bits of the address A01–Aij, respectively.

The operation of the redundancy circuit with the above-mentioned construction in accordance with the third embodiment of the present invention will hereinafter be described in detail with reference to FIGS. 8a to 8f.

Figure 8A:
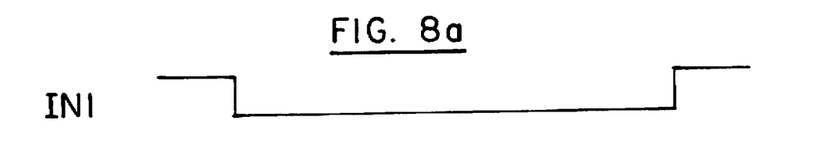
FIGS. 8a to 8f are timing diagrams illustrating the operation of the redundancy circuit in FIG. 7.
Figure 8B:
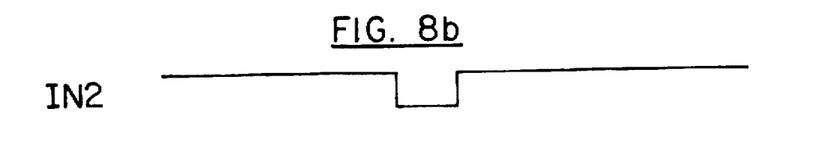
Figure 8C:
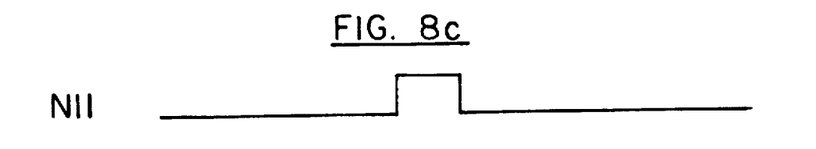

FIGS. 8a to 8f are timing diagrams illustrating the operation of the redundancy circuit in FIG. 7. First, when the first precharge signal in1 goes from high to low in logic as shown in FIG. 8a and the second precharge signal in1 then goes from high to low in logic as shown in FIG. 8b, the first and second precharge transistors MP1 and MP2 are turned on to transfer the supply voltage Vcc to the first node N1. As a result, a signal at the first node N1 becomes high in logic and the output signal out at the output terminal N2 becomes low in logic. The output signal out at the output terminal N2 is inverted by the fourth inverter 14 and then applied to the NAND gate NA1, which also receives the second precharge signal in2. As a result, the output signal from the NAND gate NA1 becomes high in logic only while the second precharge signal in2 is low in logic.

When the second precharge signal in2 is low in logic, the output signal out at the output terminal N2 becomes low in logic to allow the repair operation to be performed. Only in this case is the eleventh NMOS transistor MN11 turned on to allow the signal at the first node N1 to remain at its high logic state and the output signal out at the output terminal N2 to remain at its low logic state.

Figure 8D:
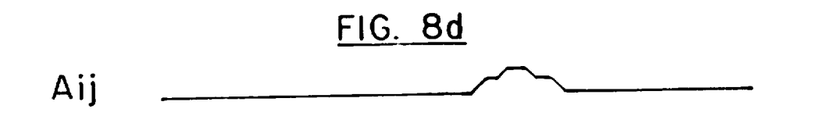
Figure 8E:
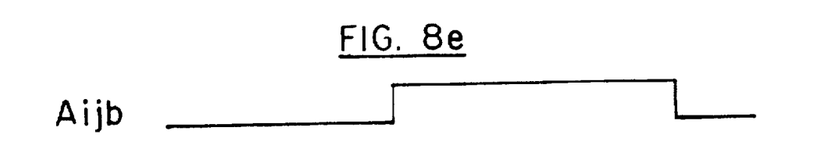
Figure 8F:
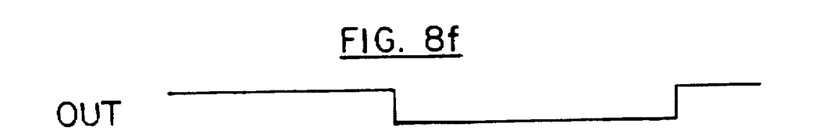

At this time, although an address bit, not selected, has a threshold voltage level Vtn or more due to noise in the chip, like the address bit Aij in FIG. 8d, and the corresponding repair transistor MN7 is then turned on, the signal at the first node N1 has no voltage variation because the eleventh NMOS transistor MN11 remains at its OFF state. Then, if the output signal out at the output terminal N2 goes from low to high in logic, the output signal from the NAMD gate NA1 becomes high in logic to turn on the eleventh NMOS transistor MN11, so as to accept a new address. Therefore, the repair operation is stably performed with no influence of noise in the chip.

As in apparent from the above description, according to the present invention, when a specific address is applied to, the semiconductor memory device to select a failed cell, the redundancy circuit can prevent a different address from being made active due to noise in the memory device. Therefore, the repair operation can stably be performed with no influence of noise in the chip.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A redundancy circuit for a semiconductor memory device, comprising:

first precharge means for transferring a precharge voltage to a first node in response to a first precharge signal;

second precharge means for transferring said precharge voltage transferred by said first precharge means to said first node in response to a second precharge signal;

first inversion means for inverting a signal at said first node;

an output terminal for transferring an output signal from said first inversion means externally;

first switching means for transferring a supply voltage to said first node in response to a signal at said output terminal;

second inversion means for inverting said second precharge signal;

second switching means for transferring a ground voltage to a second node in response to an output signal from said second inversion means;

third switching means for transferring said ground voltage to said second node in response to said signal at said output terminal;

a plurality of fourth switching means connected in parallel between said first and second nodes, for transferring a signal at said second node to said first node in response to an input address, each of said fourth switching means having its gate for inputting a corresponding one of a plurality of bits of said input address; and a plurality of fuses connected respectively between said first node and said fourth switching means, for programming a failed address.

2. A redundancy circuit for a semiconductor memory device, as set forth in claim 1, further comprising fifth switching means for transferring said ground voltage to said first node in response to said first precharge signal.

3. A redundancy circuit for a semiconductor memory device, as set forth in claim 2, wherein said fifth switching means include a NMOS transistor.

4. A redundancy circuit for a semiconductor memory device, as set forth in claim 1, wherein said input address is a row address.

5. A redundancy circuit for a semiconductor memory device, as set forth in claim 1, wherein said input address is a column address.

6. A redundancy circuit for a semiconductor memory device, as set forth in claim 1, wherein said second precharge signal goes from high to low in logic after said first precharge signal goes from high to low in logic, and then remains at its low logic state for a predetermined time period.

7. A redundancy circuit for a semiconductor memory device, as set forth in claim 1, wherein each of said fuses blows when an enabled one of said input address bits is applied to said gate of a corresponding one of said fourth switching means to select a failed cell.

8. A redundancy circuit for a semiconductor memory device, as set forth in claim 1, wherein each of said first and second precharge means include a PMOS transistor.

9. A redundancy circuit for a semiconductor memory device, as set forth in claim 1, wherein each of said first to fourth switching means include a NMOS transistor.

10. A redundancy circuit for a semiconductor memory device, comprising:

first precharge means for transferring a precharge voltage to a first node in response to a first precharge signal;

second precharge means for transferring said precharge voltage transferred by said first precharge means to said first node in response to a second precharge signal;

inversion means for inverting a signal at said first node;

an output terminal for transferring an output signal from said inversion means externally;

first switching means for transferring a supply voltage to said first node in response to a signal at said output terminal;

edge signal generation means for generating an edge signal with a predetermined delay width in response to said signal at said output terminal;

second switching means for transferring a ground voltage to a second node in response to an output signal from said edge signal generation means;

a plurality of third switching means connected in parallel between said first and second nodes, for transferring a signal at said second node to said first node in response to an input address, each of said third switching means having its gate for inputting a corresponding one of a plurality of bits of said input address; and a plurality of fuses connected respectively between said first node and said third switching means, for programming a failed address.

11. A redundancy circuit for a semiconductor memory device, as set forth in claim 10, further comprising fourth switching means for transferring said ground voltage to said first node in response to said first precharge signal.

12. A redundancy circuit for a semiconductor memory device, as set forth in claim 11, wherein said fourth switching means include a NMOS transistor.

13. A redundancy circuit for a semiconductor memory device, as set forth in claim 10, wherein said edge signal generation means include:

an inversion delay circuit for inverting and delaying said signal at said output terminal for a predetermined time period;

a NOR gate for NORing said signal at said output terminal and an output signal from said inversion delay circuit; and an inverter for inverting an output signal from said NOR gate and outputting the inverted signal to said second switching means.

14. A redundancy circuit for a semiconductor memory device, as set forth in claim 13, wherein said inversion delay circuit includes an odd number of inverters.

15. A redundancy circuit for a semiconductor memory device, as set forth in claim 13, wherein said output signal from said inversion delay circuit has a low to high logic transition interval similar to that of said first precharge signal.

16. A redundancy circuit for a semiconductor memory device, as set forth in claim 10, wherein said input address is a row address.

17. A redundancy circuit for a semiconductor memory device, as set forth in claim 10, wherein said input address is a column address.

18. A redundancy circuit for a semiconductor memory device, as set forth in claim 10, wherein said second precharge signal goes from high to low in logic after said first precharge signal goes from high to low in logic, and then remains at its low logic state for a predetermined time period.

19. A redundancy circuit for a semiconductor memory device, as set forth in claim 10, wherein each of said fuses blows when an enabled one of said input address bits is applied to said gate of a corresponding one of said third switching means to select a failed cell.

20. A redundancy circuit for a semiconductor memory device, as set forth in claim 10, wherein each of said first and second precharge means include a PMOS transistor.

21. A redundancy circuit for a semiconductor memory device, as set forth in claim 10, wherein each of said first to third switching means include an NMOS transistor.

22. A redundancy circuit for a semiconductor memory device, comprising:

first precharge means for transferring a precharge voltage to a first node in response to a first precharge signal;

second precharge means for transferring said precharge voltage transferred by said first precharge means to said first node in response to a second precharge signal;

inversion means for inverting a signal at said first node;

an output terminal for transferring an output signal from said inversion means externally;

first switching means for transferring a supply voltage to said first node in response to a signal at said output terminal;

edge signal generation means for generating an edge signal with a predetermined width in response to said signal at said output terminal and said second precharge signal;

second switching means for transferring a ground voltage to a second node in response to an output signal from said edge signal generation means;

a plurality of third switching means connected in parallel between said first and second nodes, for transferring a signal at said second node to said first node in response to an input address, each of said third switching means having its gate for inputting a corresponding one of a plurality of bits of said input address; and a plurality of fuses connected respectively between said first node and said third switching means, for programming a failed address.

23. A redundancy circuit for a semiconductor memory device, as set forth in claim 22, further comprising fourth switching means for transferring said ground voltage to said first node in response to said first precharge signal.

24. A redundancy circuit for a semiconductor memory device, as set forth in claim 23, wherein said fourth switching means includes an NMOS transistor.

25. A redundancy circuit for a semiconductor memory device, as set forth in claim 22, wherein said edge signal generation means is include;

an inverter for inverting said signal at said output terminal; and a NAND gate for NANDing said second precharge signal and an output signal from said inverter and outputting the NANDed result to said second switching means.

26. A redundancy circuit for a semiconductor memory device, as set forth in claim 22, wherein said input address is a row address.

27. A redundancy circuit for a semiconductor memory device, as set forth in claim 22, wherein said input address is a column address.

28. A redundancy circuit for a semiconductor memory device, as set forth in claim 22, wherein said second precharge signal goes from high to low in logic after said first precharge signal goes from high to low in logic, and then remains at its low logic state for a predetermined time period.

29. A redundancy circuit for a semiconductor memory device, as set forth in claim 22, wherein each of said fuses blows when an enabled one of said input address bit& is applied to said gate of a corresponding one of said third switching means to select a failed cell.

30. A redundancy circuit for a semiconductor, memory device, as set forth in claim 22, wherein each of said first and second precharge means include a PMOS transistor.

31. A redundancy circuit for a semiconductor memory device, as set forth in claim 22, wherein each of said first to third switching means include a NMOS transistor.

* * * * *

UNITED STATES PATENT AND TRADEMARK OFFICE
CERTIFICATE OF CORRECTION

PATENT NO.  : 5,768,197
DATED       : June 16, 1998
INVENTOR(S) : Jae Myoung Choi It is certified that error appears in the above-identified patent and that said Letters Patent is hereby corrected as shown below:

Claim 25, line 6, replace "ga te" with --gate--.

Claim 29, line 3, replace "bit&" with --bits--.

Signed and Sealed this

Sixth Day of October, 1998

Attest:

Attesting Officer

BRUCE LEHMAN

Commissioner of Patents and Trademarks